(12) United States Patent
Inoue

(10) Patent No.: US 6,963,299 B2
(45) Date of Patent: Nov. 8, 2005

(54) AD CONVERSION METHOD

(75) Inventor: Hideo Inoue, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/935,099

(22) Filed: Sep. 8, 2004

(65) Prior Publication Data

US 2005/0052302 A1 Mar. 10, 2005

(30) Foreign Application Priority Data

Sep. 10, 2003 (JP) .............................. 2003-317913

(51) Int. Cl.[7] .............................................. H03M 1/12
(52) U.S. Cl. ...................................... 341/155; 341/144
(58) Field of Search ........................ 341/108, 110, 118, 341/120, 143, 144, 155

(56) References Cited

U.S. PATENT DOCUMENTS

| | | | | |
|---|---|---|---|---|
| 4,736,189 A | * | 4/1988 | Katsumata et al. | ......... 341/120 |
| 5,047,772 A | * | 9/1991 | Ribner | ........................ 341/156 |
| 5,361,067 A | * | 11/1994 | Pinckley | ...................... 341/120 |
| 6,054,945 A | * | 4/2000 | Doyle | ......................... 341/150 |
| 6,313,779 B1 | * | 11/2001 | Leung et al. | ................ 341/155 |

FOREIGN PATENT DOCUMENTS

JP 10-107632 4/1998

* cited by examiner

*Primary Examiner*—Brian Young
(74) *Attorney, Agent, or Firm*—McDermott Will & Emery LLP

(57) ABSTRACT

At step S1, an analog signal is input. At step S2, a high potential and a low potential input to a DA converter are respectively selected. At step S3, a first AD conversion of the analog signal is performed. At step S4, a voltage range is narrowed down by respectively switching the high potential and the low potential on the basis of conversion data from the first AD conversion. At step S5, a second AD conversion of the analog signal is performed. At step S6, the conversion data from the first AD conversion and conversion data from the second AD conversion are combined to be output as a single digital signal.

16 Claims, 4 Drawing Sheets

AD CONVERSION METHOD

BACKGROUND OF THE INVENTION

1. Field of the Invention

This invention relates to a technique for improving the resolution of a successive comparison type AD conversion method.

2. Description of the Background Art

Improvement of the resolution of an AD conversion method requires high-precision tuning of the configuration of a ladder resistor and an analog circuit inside an AD converter to be used. However, for an improved resolution by one bit, for example, a voltage value by resistors division to be taken out at the ladder resistor may double, which requires a corresponding increase in the number of resistors included in the ladder resistor. This results in such a problem of an increase in footprint of the AD converter on an IC chip.

Japanese Patent Application Laid-Open No. 10-107632 (1998) discloses an exemplary AD conversion method with an improved resolution by switching between a fine comparator and a coarse comparator connected to a ladder resistor.

An AD converter used in the AD conversion method disclosed in the above publication includes two kinds of devices (comparator and encoder) for fineness and coarseness. This results in a problem of a corresponding increase in footprint.

SUMMARY OF THE INVENTION

It is an object of this invention to provide an AD conversion method with an improved resolution without any increase in footprint.

This invention is directed to an AD conversion method using an AD converter including an analog input terminal, a DA converter, a comparator, and a digital output terminal. A first analog signal to be subjected to AD conversion is input to the analog input terminal. The DA converter has a resolution of prescribed bits and is applied with a high potential and a low potential. The comparator performs a comparison operation between a second analog signal output from the DA converter and the first analog signal. The digital output terminal outputs a digital signal on the basis of a comparison result output from the comparator. The AD conversion method of this invention includes steps (a) to (e). The step (a) inputs the first analog signal from the analog input terminal. The step (b) obtains a first comparison result by performing the comparison operation with a prescribed first high potential and a prescribed first low potential being supplied to the DA converter. The step (c) switches the first high potential and the first low potential supplied to the DA converter to a second high potential and a second low potential, respectively, on the basis of the first comparison result. The step (d) obtains a second comparison result by performing the comparison operation after the step (c). The step (e) generates a digital signal on the basis of the first and second comparison results and outputs the digital signal from the digital output terminal.

Since no addition is needed to the configuration of the DA converter, the resolution of the AD conversion is improved without any increase in footprint.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

An AD conversion method in a first preferred embodiment improves a resolution by narrowing down a range of a voltage applied to a DA converter included in a successive comparison type AD converter on the basis of conversion data obtained from a first AD conversion, and then performing a second AD conversion.

Figure 1:
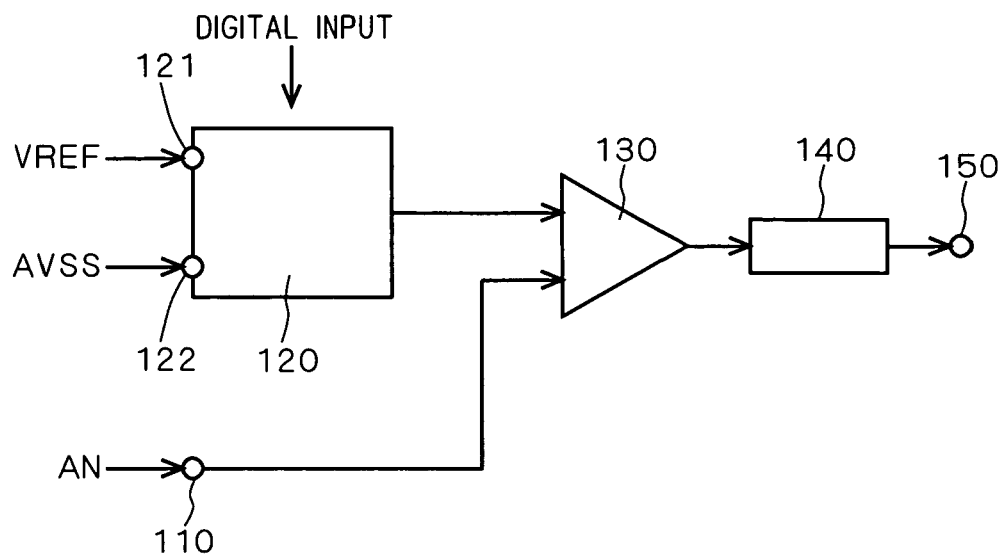
FIG. 1 shows an exemplary configuration of an AD converter according to a first preferred embodiment.
Figure 2:
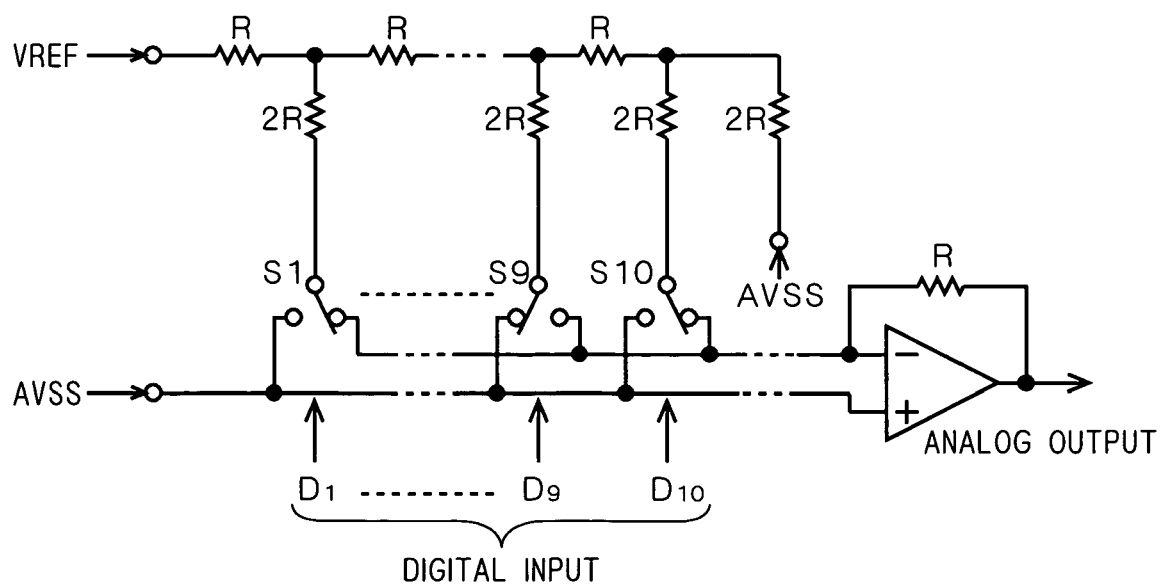
FIG. 2 shows an exemplary configuration of a DA converter included in the AD converter according to the first preferred embodiment.

FIGS. 1 and 2 show exemplary configurations of the successive comparison type AD converter according to the first preferred embodiment of this invention.

First, the configuration and basic operation of the AD converter shown in FIG. 1 will be described.

An analog signal (first analog signal) AN to be subjected to AD conversion is input from an analog input terminal 110 and then to one input part of a comparator 130. When a plurality of analog input terminals are provided in contrast to one analog input terminal (one channel) as shown in FIG. 1, a desired one channel can be selected and input from among analog signals of the plurality of channels by interposing a selector circuit.

A DA converter 120 includes a high-potential terminal 121 and a low-potential terminal 122, and has a resolution of prescribed bits (e.g. 10 bits in this case). A high potential VREF is input to the high-potential terminal 121 and a low potential AVSS is input to the low-potential terminal 122. The DA converter 120 converts a prescribed digital signal input thereto into an analog signal (second analog signal) and inputs it to the other input part of the comparator 130. The comparator 130 compares the values of the first and second analog signals input thereto, and outputs the comparison result to a resistor 140.

The resistor 140 stores the comparison result input thereto in bit format.

A comparison operation for one bit is performed by the above operation. The voltage value of the analog signal input to the other input part of the comparator 130 is successively changed by successively changing the digital signal input to the DA converter 120, and the comparison operations for the bits of the resolution, namely ten comparison operations are performed sequentially from the most significant bit to the least significant bit, whereby the respective comparison results are stored in the register 140 as conversion data of ten bits. The conversion data of ten bits is output from a digital output terminal 150 as a single digital signal. As a result, the analog signal AN that was input is converted into a digital signal.

FIG. 2 shows an exemplary configuration of the DA converter 120. The DA converter 120 includes a ladder resistor having a plurality of resistors combined in ladder form, for example, and switches switches S1 to S10 in accordance with the values of respective bits $D_1$ to $D_{10}$ of the digital signal input thereto, thereby converting the digital signal into an analog signal and outputting it.

Figure 3:
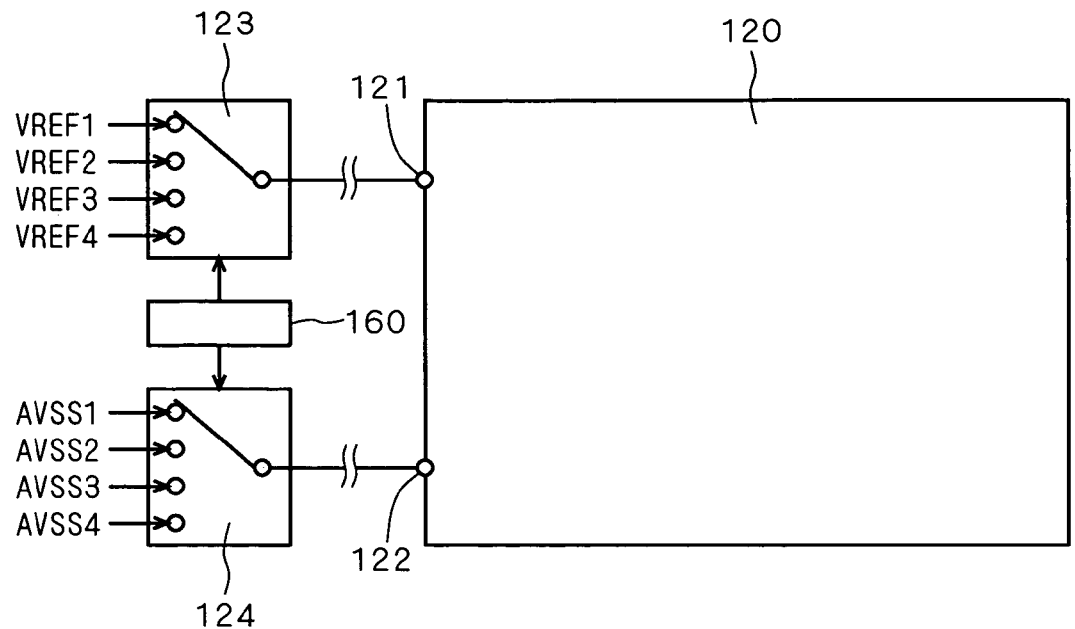
FIG. 3 shows an exemplary configuration of the AD converter according to the first preferred embodiment.

FIG. 3 shows high-potential switching means 123 and low-potential switching means 124 connected to the high-potential terminal 121 and the low-potential terminal 122 of the DA converter 120, respectively. The high-potential switching means 123 and the low-potential switching means 124 are controlled by a central control device 160 operating with a prescribed program. The high-potential switching means 123 selects any one from a plurality of high potentials (e.g. high potentials VREFs 1 to 4 in this case) as the high potential VREF and inputs it to the high-potential terminal 121. The low-potential switching means 124 selects any one from a plurality of low potentials (e.g. low potentials AVSSs 1 to 4) as the low potential AVSS and inputs it to the low-potential terminal 122.

Figure 4:
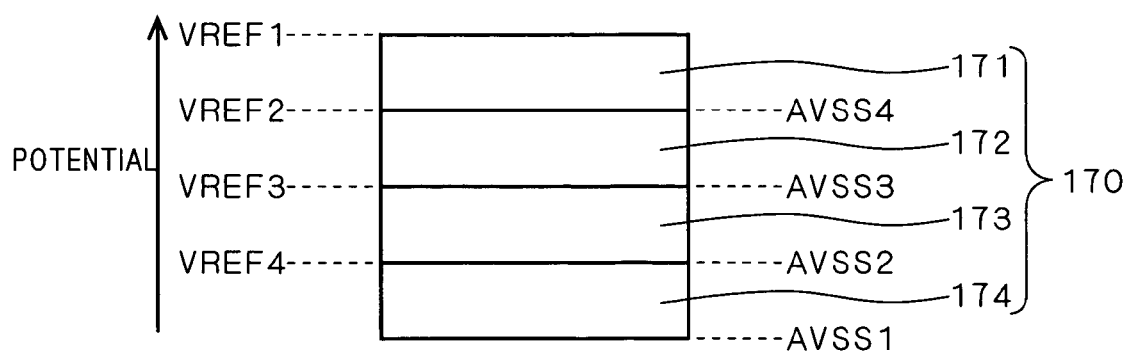
FIG. 4 shows a voltage range of the AD converter according to the first preferred embodiment.

As shown in FIG. 4, there is a relationship between the high potentials VREFs 1 to 4 and the low potentials AVSSs 1 to 4 that VREF1>VREF2=AVSS4>VREF3=AVSS3>VREF4=AVSS2>AVSS1. A voltage range 170 between the VREF1 and the AVSS1 is divided into four equal voltage ranges 171 to 174 by the VREF2 (AVSS4), the VREF3 (AVSS3) and the VREF4 (AVSS2). The high potential VREF1 is set so as not to be less than the potential of the analog signal AN, and the low potential AVSS1 is set so as not to be more than the potential of the analog signal AN. Namely, the high potential VREF1 and the low potential AVSS1 are set such that the potential of the analog signal AN falls within the voltage range 170.

In this preferred embodiment, the above potentials should be such that VREF1=5.12 V, VREF2=AVSS4=3.84 V, VREF3=AVSS3=2.56 V, VREF4= AVSS2=1.28 V, and AVSS1=0 V, for example. With the scope of the voltage range 170 being 5.12 V and the resolution of the DA converter 120 being of 10 bits, the resolution per bit of the AD converter is 5.12 V/1024 (2 to the $10^{th}$ power)=5 mV. The voltage range 170 is thus divided into the four equal voltage ranges 171 to 174 each having a scope of 1.28 V.

Next, the AD conversion method according to this preferred embodiment will be described referring to a flowchart shown in FIG. 5.

First, at step S1, the analog signal AN is input to the AD converter from the analog input terminal 110.

Second, at step S2, the high potential VREF1 and the low potential AVSS1 are respectively selected using the high-potential switching means 123 and the low-potential switching means 124 shown n FIG. 3. Namely, the voltage range 170 is determined.

Returning to FIG. 5, then at step S3, the first AD conversion of the analog signal AN is performed by the ten comparison operations by the comparator 130, and the comparison results are stored in the resister 140 as the conversion data of ten bits.

Next, at step S4, the central control device 160 switches the high potential VREF and the low potential AVSS respectively by controlling the high-potential switching means 123 and the low-potential switching means 124. In this switching, one of the voltage ranges is selected having a scope within which the conversion data of ten bits obtained at the step S3 remains. Namely, any one from the voltage ranges 171 to 174 in FIG. 4 is selected depending on the value among 11, 10, 01 and 00 (binary in any of those instances) of two high order bits of the conversion data obtained. For example, when the conversion data is 0001100100 (digital value equivalent to 1 V), the two high order bits are 00 and thus the voltage range 174 is selected by selecting the high potential VREF4 and the low potential AVSS1.

Next, at step S5, the second AD conversion of the analog signal AN is performed by the ten comparison operations by the comparator 130, and the comparison results are stored in the resister 140 as the conversion data of ten bits.

Then, at step S6, the conversion data of ten bits stored in the register 140 at the step S5 is combined with the two high order bits of the conversion data obtained at the step S3, and output from the digital output terminal 150 as a single digital signal of twelve bits.

The above steps S1 to S6 complete the AD conversion according to this preferred embodiment.

The AD conversion as discussed above improves the resolution by four times by selecting one from the four voltage ranges 171 to 174 included in the voltage range 170 at the step S4. Namely, with the scope of the voltage range 174 being 1.28 V, the resolution per bit of the AD converter is 1.28 V/1024=1.25 mV. In short the AD converter has a pseudo-resolution equivalent to twelve bits by obtaining two high order bits from the first AD conversion and ten low order bits from the second AD conversion, respectively.

Modification

As discussed above, the first AD conversion at the step S3 calculates the conversion data of ten bits. However, since the result of the first AD conversion is for selecting one from the voltage ranges 171 to 174 at the step S4, the calculation of only two high order bits is enough. This reduces the number of the comparison operations at the step S3.

Figure 6:
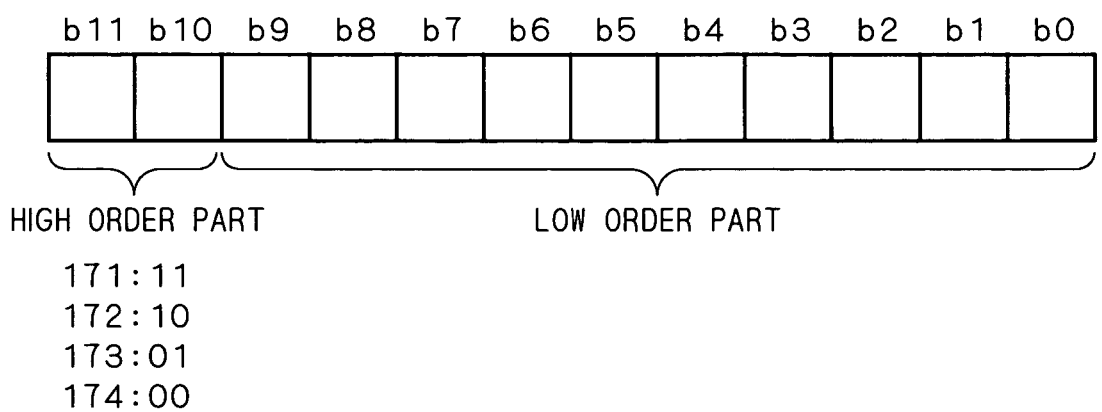
FIG. 6 illustrates conversion data from an AD conversion method according to a modification of the first preferred embodiment.

FIG. 6 illustrates an example where the two bits calculated at the step S3 are stored in the high order part and the ten bits calculated at the step S5 are stored in the low order part in the resister 140, respectively. As the two bits in the high order part, any one from 11, 10, 01 and 00 (binary in any of those instances) is stored to correspond to the selected one from the voltage ranges 171 to 174. Consequently, the two bits in the high order part obtained from the first AD conversion at the step S3 and the ten bits in the low order part obtained from the second AD conversion at the step S5 can be combined to be handled as single conversion data having a resolution of twelve bits.

Figure 7:
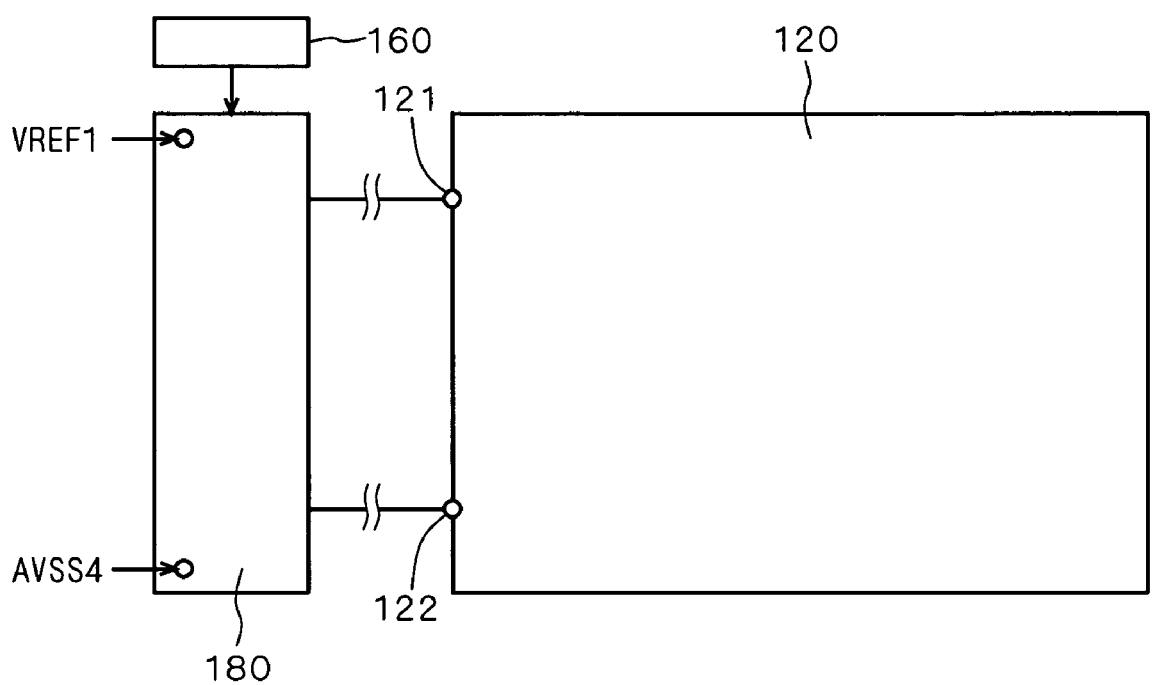
FIG. 7 shows an exemplary configuration of an AD converter according to the modification of the first preferred embodiment.

In the above description, the voltage range is switched using the high-potential switching means 123 and the low-potential switching means 124, as shown in FIG. 3. Alternatively, as shown in FIG. 7, those means may be replaced by a VDC (voltage down converter) 180 included in the AD converter. Control of the VDC 180 using the central control device 160 allows an arbitrary potential to be set between the VREF1 and the AVSS4.

Figure 5:
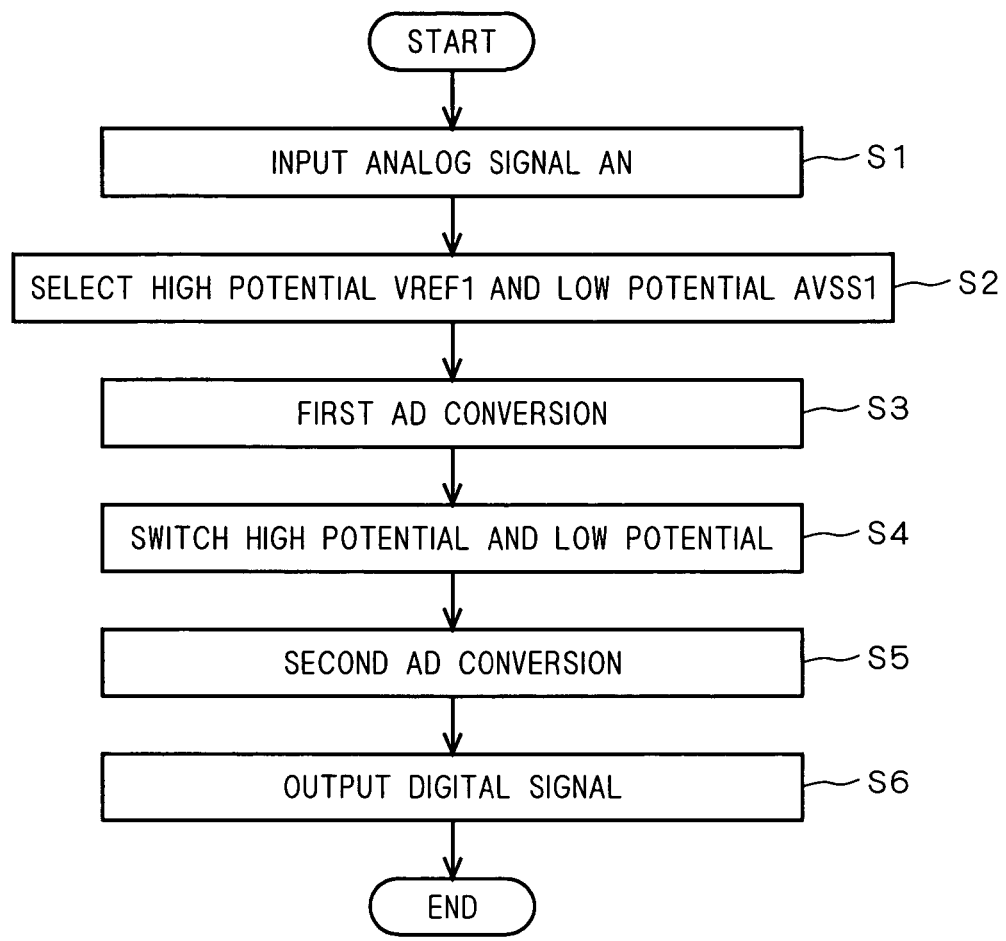
FIG. 5 is a flowchart illustrating an AD conversion method according to the first preferred embodiment.

Further, after performing the step S4 of switching the potentials in the FIG. 5 flowchart, the transition to the step 5 may take place after waiting a prescribed time interval for stabilizing a power source supplying the potentials. A counter, which is included in the AD converter but not shown, may be used to set desired waiting time.

As discussed above, in the AD conversion method according to this preferred embodiment, the range of the voltage applied to the DA converter is narrowed down on the basis of the conversion data obtained from the first AD conversion, and then the second AD conversion is performed. This eliminates an addition to the configuration of the DA converter, thereby producing the effect of improving the resolution of the AD conversion without any increase in footprint.

Further, only two high order bits are calculated in the first AD conversion at the step S3, thereby producing the effect of reducing the number of the comparison operations.

Still further, the respective conversion data from the first and second AD conversions are stored in the high order part and the low order part in the register, respectively, thereby producing the effect of combining and handling the respective data as single conversion data having a resolution of twelve bits.

Moreover, the potential generation using the VDC produces the effect of setting an arbitrary potential.

Furthermore, the setting of the desired waiting time using the counter produces the effect of driving the DA converter 120 with a stable power supply potential.

While the invention has been shown and described in detail, the foregoing description is in all aspects illustrative and not restrictive. It is therefore understood that numerous modifications and variations can be devised without departing from the scope of the invention.

What is claimed is:

1. An AD conversion method using an AD converter, said AD converter comprising:
    an analog input terminal to which a first analog signal to be subjected to AD conversion is input;
    a DA converter having a resolution of prescribed bits and applied with a high potential and a low potential;
    a comparator performing a comparison operation between a second analog signal output from said DA converter and said first analog signal; and
    a digital output terminal outputting a digital signal on the basis of a comparison result output from said comparator,
    said AD conversion method comprising the steps of:
    (a) inputting said first analog signal from said analog input terminal;
    (b) obtaining a first comparison result by performing said comparison operation with a prescribed first high potential and a prescribed first low potential being supplied to said DA converter;
    (c) switching said first high potential and said first low potential supplied to said DA converter to a second high potential and a second low potential, respectively, on the basis of said first comparison result;
    (d) obtaining a second comparison result by performing said comparison operation after said step (c); and
    (e) generating a digital signal on the basis of said first and second comparison results and outputting said digital signal from said digital output terminal.

2. The AD conversion method according to claim 1, wherein
    said step (b) comprises the step of obtaining said first comparison result that only corresponds to prescribed high order bits.

3. The AD conversion method according to claim 1, wherein
    said step (e) comprises the steps of:
    storing said first comparison result in the high order bit part in a register; and
    storing said second comparison result in the low order bit part in said register.

4. The AD conversion method according to claim 2, wherein
    said step (e) comprises the steps of:
    storing said first comparison result in the high order bit part in a register; and
    storing said second comparison result in the low order bit part in said register.

5. The AD conversion method according to claim 1, wherein
    said second high potential and said second low potential are generated using a voltage down converter.

6. The AD conversion method according to claim 2, wherein
    said second high potential and said second low potential are generated using a voltage down converter.

7. The AD conversion method according to claim 3, wherein
    said second high potential and said second low potential are generated using a voltage down converter.

8. The AD conversion method according to claim 4, wherein
    said second high potential and said second low potential are generated using a voltage down converter.

9. The AD conversion method according to claim 1, further comprising the step of:
    waiting a prescribed time interval after said step (c) to thereby stabilize a power supply potential supplying said second high potential and said second low potential.

10. The AD conversion method according to claim 2, further comprising the step of:
    waiting a prescribed time interval after said step (c) to thereby stabilize a power supply potential supplying said second high potential and said second low potential.

11. The AD conversion method according to claim 3, further comprising the step of:
    waiting a prescribed time interval after said step (c) to thereby stabilize a power supply potential supplying said second high potential and said second low potential.

12. The AD conversion method according to claim 4, further comprising the step of:
    waiting a prescribed time interval after said step (c) to thereby stabilize a power supply potential supplying said second high potential and said second low potential.

13. The AD conversion method according to claim 5, further comprising the step of:
    waiting a prescribed time interval after said step (c) to thereby stabilize a power supply potential supplying said second high potential and said second low potential.

14. The AD conversion method according to claim 6, further comprising the step of:
    waiting a prescribed time interval after said step (c) to thereby stabilize a power supply potential supplying said second high potential and said second low potential.

15. The AD conversion method according to claim 7, further comprising the step of:
    waiting a prescribed time interval after said step (c) to thereby stabilize a power supply potential supplying said second high potential and said second low potential.

16. The AD conversion method according to claim 8, further comprising the step of:
    waiting a prescribed time interval after said step (c) to thereby stabilize a power supply potential supplying said second high potential and said second low potential.

* * * * *